| United States Patent [19] | [11] Patent Number: 4,904,761 |
| Okitsu et al. | [45] Date of Patent: Feb. 27, 1990 |

[54] RESIN COMPOSITION FOR SEALING SEMICONDUCTORS

[75] Inventors: Yuji Okitsu, Tokyo; Koichi Machida; Motoyuki Torikai, both of Yokohoma; Junko Tsuji, Oiso; Kotaro Asahina, Kamakura; Kazuya Shinkoda, Ninomiya; Takayuki Kubo; Mikio Kitahara, both of Yokohama, all of Japan

[73] Assignee: Mitsui Toatsu Chemicals, Inc., Tokyo, Japan

[21] Appl. No.: 275,018

[22] Filed: Nov. 22, 1988

[51] Int. Cl.$^4$ .................. C08L 83/04; C08L 63/10; C08K 3/36
[52] U.S. Cl. .................................. 523/435; 523/466; 525/476
[58] Field of Search ................ 523/435, 466; 525/65, 525/476, 479

[56] References Cited

U.S. PATENT DOCUMENTS

| 3,577,263 | 5/1971 | Nordstrom | 525/476 |
| 4,663,397 | 5/1987 | Morita et al. | 525/476 |
| 4,707,529 | 11/1987 | Hoffman et al. | 525/476 |

*Primary Examiner*—Lewis T. Jacobs
*Attorney, Agent, or Firm*—Burns, Doane, Swecker & Mathis

[57] ABSTRACT

A semiconductor sealing resin composition which comprises (a) a modified epoxy resin which is a graft copolymer of a epoxy resin and a vinyl polymer having dispersed therein a silicone rubber with an average particle diameter less than $1.0\mu$; (b) a curing agent; and (c) an inorganic filler. The sealing composition has a low elastic modulus, a low heat expansion coefficient, a high resistance to heat and a high resistance to thermal expansion.

16 Claims, No Drawings

RESIN COMPOSITION FOR SEALING SEMICONDUCTORS

BACKGROUND OF THE INVENTION (1) Field of the Invention

The present invention relates to a resin composition for sealing semiconductors. The composition has a low elastic modulus, a low heat expansion coefficient, a high resistance to heat and a high resistance to thermal shock. Accordingly, the composition is particularly suitable for sealing electronic parts, such as semiconductors, where high reliability is required.

(2) Description of the Prior Art

Recently, so-called plastic sealing using thermosetting plastics, such as epoxy resins, has been widely commercialized to seal semiconductors. This is due to its economical merits, for example, relatively cheap material cost and ease of mass production. One particular resin composition used for this purpose comprises a polyfunctional epoxy resin, a phenol novolac resin and an inorganic filler. The composition is characterized by its high heat resistance, good processability and excellent electrical properties.

As the high integration of semiconductor chips has advanced, the size of the chips have become larger. On the other hand, as the high density assembly of semiconductors to a substrate has progressed, the shape of chip-containing packages have become smaller and thinner, such as a flat package.

The demand for packages in the art has caused some failures which have heretofore not been observed using conventional sealing resins. The stress caused by the heat expansion coefficient differences between the sealing resin and the chip, due to increased chip size and the decrease of resin layer thickness is believed to have led to cracking of the passivation film or cracking of the sealing resin composition by thermal shock. This cracking decreases the humidity resistance of the semiconductor and results in low reliability of the semiconductor. Therefore, it has been desired to develop a sealing resin which has decreased stress.

One way to decrease the stress is by reducing the heat expansion coefficient of the resin to reduce the rate difference between the heat expansion rate of the resin and that of the chip. However, the rate difference between the resin and the chip is generally so large that to lessen the rate difference, it is necessary to incorporate a large amount of inorganic filler which has a lower heat expansion coefficient. This type of inorganic filler has already been used for this purpose in sealing resins, so raising the amount of the filler leads to unacceptable processability.

Another way to decrease the stress is by reducing the elastic modulus of the resin. For this purpose, attempts have been made to add a plasticizer into the resin, to use a pliable epoxy resin or to use a phenolic resin. However, the cured resins obtained by such attempts have insufficient heat resistance.

As represented by the Japanese Laid Open Patent (Tokkyo Kokai Koho) No. 58-108220, it was proposed to maintain the heat resistance of the resin by dispersing rubber particles in the sealing resin to give the resin crack-resistant properties. However, this method provides certain problems such as resin deposits on the mold or low heat shock resistance at temperatures above the glass transition temperature which typically are encountered in a bath of molten solder. The low heat shock resistance results in a decrease of the reliability of the semiconductor after dipping in the bath of molten solder which is a fatal defect for sealing materials used for integrated circuits.

Additionally, if the degree of deposit on the mold is large, it is necessary to clean the mold frequently which leads to low productivity and reduced economy.

SUMMARY OF THE INVENTION

The present invention provides a sealing resin composition for semiconductors, especially for integrated circuits where high reliability is required. The resin composition experiences lower stress when used to seal semiconductors and has a high resistance to thermal shock. Additionally, the resin composition of the present invention can leave less deposit on the mold during processing.

After intensive research, it has been found that an effective result is obtained by dispersing fine particles of silicone rubber which is the reaction product of a polyaddition reaction of a silicone polymer. Further investigation has shown the importance of the particle size of the silicone rubber and thus the present invention has been developed.

In one aspect the present invention provides a semiconductor sealing resin composition which comprises a modified epoxy resin which is a graft copolymer of a epoxy resin and a vinyl polymer having dispersed therein a silicone rubber with an average particle diameter less than $1.0\mu$.

DESCRIPTION OF THE PREFERRED EMBODIMENTS

The epoxy resin used in the present invention may be any polyvalent epoxy resin. It is preferable to use an epoxynovolac resin of glycidyl compounds such as phenol novolac or cresol novolac for their good electrical properties and high heat resistance. Another epoxy resin which can be used is selected from the reaction product of epichlorohydrin o 2-methyl epichlorohydrin and a compound which has at least two active hydrogen atoms in the molecule. Exemplary compounds having at least two active hydrogen atoms in the molecule include: polyvalent phenolic compounds illustrated by bisphenol A, bishydroxy diphenyl methane, resorcinol, bishydroxy diphenyl ether and tetrabromo bisphenol A; polyvalent alcohols illustrated by ethylene glycol, neopentyl glycol, glycerine, trimethylol propane, pentaerythritol, diethylene glycol, polypropylene glycol, bisphenol A-ethylene oxide adduct and trishydroxyethylisocyanurate; polyvalent carboxylic compounds illustrated by adipic acid, phthalic acid and isophthalic acid; polyamino compounds illustrated by ethylene diamine and aniline; and epoxy resins of aliphatic compounds (including alicyclic compounds) illustrated by dicyclopentadiene epoxide or butadiene dimer epoxide.

The graft polymer used in the present invention can be prepared by carrying out the polymerization of a vinyl monomer in the presence of the previously described epoxy resin. The vinyl monomer used to prepare the vinyl polymer can be selected from alkenyl aromatic compounds, such as styrene and vinyl toluene; acrylic ester compounds, such as methyl methacrylate, dodecyl methacrylate, butoxyethyl methacrylate, glycidyl methacrylate, methyl acrylate, butyl acrylate, 2-ethylhexyl acrylate, hydroxyethyl acrylate and trimethylolpropane triacrylate; acrylic compounds which have no ester groups such as acrylonitrile, acrylic acid, butoxy methyl acrylamide and methacrylamide; nonconjugated vinyl compounds, such as vinyl acetate, vinyl laurate, vinyl varsatate, vinyl chloride, vinylidene chloride, ethyl and arylacetate; and conjugated diene compounds, such as butadiene, isoprene and chloroprene. Other polymerizable vinyl compounds can also be used such as vinyl silicone, dibutyl fumarate, mono methyl maleate, diethyl itaconate; and fluorinated compounds of methacrylic or acrylic acid, such as tetrafluoroethyl methacrylic acid or tetrafluoro-propyl methacrylic acid.

The amount of the vinyl polymer is usually from about 1 to about 50 parts by weight to the 100 parts by weight of the epoxy resin.

Preparation of the vinyl polymer is typically conducted by polymerizing the vinyl monomer in the presence of a free radical initiator. The initiator can be selected from peroxides, such as lauroyl peroxide, benzoyl peroxide, tertiary butyl perbenzoate, dimethyl dibenzoyl peroxyhexane, tertiary butyl perpivalate, ditertiary butyl peroxide, 1,1-bistertiary butyl peroxy-3,3,5-trimethyl cyclohexane, dimethyl ditertiary butyl peroxyhexane, tertiary butyl cumyl peroxide, methyl ethyl ketone peroxide, cumene hydroperoxide, cyclohexanone peroxide cumenehydroperoxide, tertiary butyl peroxyaryl carbonate, dioctylperoxy dicarbonate, tertiary butyl peroxy maleic acid, succinic acid peroxide, tertiary butyl peroxy isopropylcarbonate and hydrogen peroxide. Other initiators which can be used are azo compounds such as azobisisobutyronitrile or azobisdimethylvaleronitrile. The amount of the initiator is usually below 10% by weight of the polymerizable vinyl compound.

In some instances, a reducing agent may also be used to carry out a so-called redox polymerization reaction. Polymerization can also be conducted in the presence of a polymerization inhibitor, such as hydroquinone, and/or a chain transfer agent, such as dodecylmercaptan.

The polymerization temperature is usually from about 40 to about 200° C. and the reaction time ranges from about 0.5 to about 24 hours.

To promote the graft polymerization, it is effective to have present a polymerizable double bond which is in the epoxy resin or a functional group (such as a peroxide group) which is in the epoxy resin. When a double bond is used, it is typical to react in advance an epoxy resin and a compound having both a functional group and a double bond, such as acrylic acid, acrylamide, methylol acrylamide, butoxy methylacrylamide, hydroxyethyl methacrylate, glycidyl methacrylate, anhydrous maleic acid, monoethyl itaconate, monobutyl fumarate, chloromethyl styrene, phosphoxy ethyl methacrylate, chlorohydroxy propyl methacrylate, parahydroxy styrene and dimethylamino ethyl methacrylate.

The amount of the compound which has the functional group and polymerizable double bond is preferably from about 0.1 to about 10 parts per 100 parts of the epoxy resin by weight.

In the present invention, the graft polymer includes a polymer wherein some of the epoxy resin or the vinyl polymer remains in the grafted polymer without being chemically grafted.

The modified epoxy resin of the present invention can be prepared by conducting an addition reaction according to any known method between an addition reactive silicone polymer in the presence of the graft polymer of the epoxy resin and the vinyl polymer. The silicone rubber which can be used in the present invention is a rubber (either an oligomer or a polymer) produced by a silation reaction between a vinyl-modified silicone polymer which has a vinyl group within the molecule and a hydrogen-modified silicone polymer which has at least two active hydrogen atoms within the molecule.

The particle diameter of the rubber is below about 1 0μ, preferably below about 0.5μ, more preferably from about, 0.01μ to about 0.2μ. When the particle diameter is more than about 1.0μ, it is difficult to achieve the low degree of the stress which is an object of the present invention or to achieve an improvement in the resistance to thermal shock.

The vinyl-modified silicone polymer is a polysiloxane which has at least one Si—H=CH$_2$ group at the end of the molecule or inter-molecule.

The hydrogen-modified silicone polymer which has at least two Si—H groups at the ends of the molecule or intermolecule. Both of these polymers are sold commercially and combinations of a vinyl-modified silicone polymer and a hydrogen-modified silicone polymer are also commercially available. The ratio of the vinyl-modified silicone polymer to the hydrogen-modified silicone polymer is usually from about 0.1:10 to about 10:0.1, preferably from about 1:2 to about 2:1 by weight.

Typical vinyl modified polysiloxanes can have the general formula;

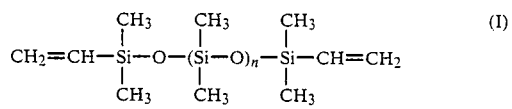

(MW = 186 to 1,000,000 and n ≧ o)

From this formula it will be noted that the silicone polymer has a Si—CH=CH$_2$ group at both ends of the molecule.

The hydrogen-modified polysiloxanes can have the general formula:

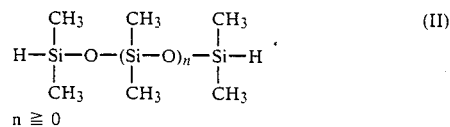

n ≧ 0

From this formula it will be noted that the polymer has a Si—H group at both ends of the molecule.

Alternatively, the hydrogen-modified polysiloxane can have the general formula:

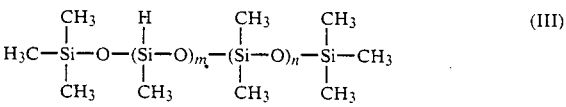

(m ≧ 2; $\frac{n \times 100}{m + n}$ = 0 to 99; and MW = 282 to 100,000)

In this embodiment, the polymer has Si—H groups in a side chain and can be adjacent or spaced along the polymer backbone.

A mixture of compounds (II) and (III) wherein the amount of compound (II) is 0 to 99% by weight is commercially available. Such a mixture is SE-1821 of Toray Silicone Corp. or KE-1204 of Shinetsu Chemicals.

As to the vinyl-modified polysiloxane and hydrogen-modified polysiloxane, any combination of the polysiloxanes can be used provided that they produce the silicone rubber by silation reaction. For the polymerization reaction, it is typical to use a platinum catalyst.

Alternative illustrative vinyl-modified polysiloxanes are:

$$CH_2=CH-\underset{\underset{CH_3}{|}}{\overset{\overset{R}{|}}{Si}}-O\underset{\underset{CH_3}{|}}{(\overset{\overset{CH_3}{|}}{Si}-O)_n}\underset{\underset{CH_3}{|}}{\overset{\overset{R}{|}}{Si}}-CH=CH_2$$

(n ≧ 0 and MW = 310 to 1,000,000
R = $C_2$-$C_{20}$ alkyl, phenyl etc.)

$$CH_2=CH-\underset{\underset{CH_3}{|}}{\overset{\overset{CH_3}{|}}{Si}}-O-\underset{\underset{CH_3}{|}}{\overset{\overset{CH_3}{|}}{Si}}-O)_m(\underset{\underset{R}{|}}{\overset{\overset{R}{|}}{Si}}-O)_n\underset{\underset{CH_3}{|}}{\overset{\overset{CH_3}{|}}{Si}}-CH=CH_2$$

(n ≧ 1 $\frac{m}{m+n} \times 100$ = 0 to 99; and MW = 288 to 1,000,000
R = $C_2$-$C_{20}$ alkyl, phenyl etc.)

$$CH_3-\underset{\underset{CH_3}{|}}{\overset{\overset{CH_3}{|}}{Si}}-O(\underset{\underset{CH_3}{|}}{\overset{\overset{CH=CH_2}{|}}{Si}}-O)_m(\underset{\underset{CH_3}{|}}{\overset{\overset{CH_3}{|}}{Si}}-O)_n\underset{\underset{CH_3}{|}}{\overset{\overset{CH_3}{|}}{Si}}-CH_3$$

(m ≧ 1; $\frac{m}{m+n} \times 100$ = 0 to 99; and MW = 248 to 1,000,000)

$$\underset{CH_2=CH}{\overset{CH_2=CH}{\diagdown}}\underset{\diagup}{\overset{\diagdown}{Si}}-O(\underset{\underset{CH_3}{|}}{\overset{\overset{CH_3}{|}}{Si}}-O)_n\underset{\diagup}{\overset{\diagdown}{Si}}\underset{CH=CH_2}{\overset{CH=CH_2}{\diagup}}$$

(n ≧ 0; and MW = 210 to 1,000,000)

Similarly, alternative illustrative vinyl-modified polysiloxanes are:

$$CH_2=CH-\underset{\underset{CH_3}{|}}{\overset{\overset{CH_3}{|}}{Si}}-O(\underset{\underset{CH_3}{|}}{\overset{\overset{CH=CH_2}{|}}{Si}}-O)_m(\underset{\underset{CH_3}{|}}{\overset{\overset{CH_3}{|}}{Si}}-O)_n\underset{\underset{CH_3}{|}}{\overset{\overset{CH_3}{|}}{Si}}-CH=CH_2$$

(m ≧ 1; $\frac{n}{m+n} \times 100$ = 0 to 99; and MW = 272 to 1,000,000)

$$CH_2=CH-Si\Big(O(Si-O)_l SiMe_3\Big)\Big(O(Si-O)_m SiMe_3\Big)\Big(O(Si-O)_n SiMe_3\Big)$$

MW = 322~1,000,000 and l, m, n ≧ 0

$$CH_2=CH-\underset{\underset{CH_3}{|}}{\overset{\overset{CH_3}{|}}{Si}}-O(\underset{\underset{CH_3}{|}}{\overset{\overset{CH_2CH_2-C_6H_5}{|}}{Si}}-O)_n\underset{\underset{CH_3}{|}}{\overset{\overset{CH_3}{|}}{Si}}-CH=CH_2$$

(n ≧ 1 and MW = 350~1,000,000)

-continued $$CH_2=CH-\underset{\underset{CH_3}{|}}{\overset{\overset{CH_3}{|}}{Si}}-\underset{}{C_6H_4}-\underset{\underset{CH_3}{|}}{\overset{\overset{CH_3}{|}}{Si}}-CH=CH_2$$

MW = 308

$$\Big(\underset{\underset{CH_3}{|}}{\overset{\overset{CH=CH_2}{|}}{Si}}-O\Big)_n$$

MW 300~500
n = 3~6

Alternative illustrative hydrogen-modified polysiloxanes are:

$$CH_3-\underset{\underset{CH_3}{|}}{\overset{\overset{CH_3}{|}}{Si}}-O(\underset{\underset{CH_3}{|}}{\overset{\overset{H}{|}}{Si}}-O)_m(\underset{\underset{R}{|}}{\overset{\overset{R}{|}}{Si}}-O)_n\underset{\underset{CH_3}{|}}{\overset{\overset{CH_3}{|}}{Si}}-CH_3$$

(m and n ≧ 1; and MW = 310 to 100,000)
R = above $C_2$ alkyl, phenyl, $-CH_2-CH_2-CN$ $-CH-CH_2-C_6H_5$ $$CH_3-\underset{\underset{CH_3}{|}}{\overset{\overset{CH_3}{|}}{Si}}-O(\underset{\underset{R}{|}}{\overset{\overset{H}{|}}{Si}}-O)_n\underset{\underset{CH_3}{|}}{\overset{\overset{CH_3}{|}}{Si}}-CH_3$$

(n ≧ 1; MW = 236 to 100,000
R = above $C_2$ alkyl, phenyl etc.)

$$CH_3-\underset{\underset{CH_3}{|}}{\overset{\overset{CH_3}{|}}{Si}}-O(\underset{\underset{CH_3}{|}}{\overset{\overset{H}{|}}{Si}}-O)_l(\underset{\underset{R}{|}}{\overset{\overset{R}{|}}{Si}}-O)_m(\underset{\underset{CH_3}{|}}{\overset{\overset{CH_3}{|}}{Si}}-O)_n\underset{\underset{CH_3}{|}}{\overset{\overset{CH_3}{|}}{Si}}-CH_3$$

(l and m ≧ 1; n ≧ 0; and MW = 324 to 100,000)
R = above $C_2$ alkyl, phenyl etc.)

The average particle diameter of the silicone rubber obtained by the addition reaction can be controlled by the amount of the grafted polymer, its molecular weight or the agitation condition during the reaction. By increasing the amount of the graft polymer, the particle diameter of the silicone rubber decreases. Increasing the agitation rate, also decreases the particle diameter. By increasing the amount of double bonds in the epoxy resin, e.g., to increase the graft points in number, the particle diameter tends to decrease. But it is difficult to control the average particle diameter of the silicone rubber below 1μ unless the graft polymer of the present invention is used.

The present composition can contain an epoxy resin as an additional component of the composition, if desired. This epoxy resin can be any of the epoxy resins used in the preparation of the previously described modified epoxy resin and can be the same or a different epoxy resin used in the preparation of the modified epoxy resin.

The amount of the epoxy resin as the additional component is below 900 parts to 100 parts of the modified epoxy resin by weight. As to the amount of the silicone rubber to the total amount of the epoxy resin used in the composition (i.e., in the modified epoxy resin and the additional component), it is necessary to use from about 5 to about 50% by weight, preferably from about 10 to 20% by weight. Below about 5% by weight, the lower stress on the resin can not be achieved. Above, about 50% by weight, the deterioration of strength detracts from its commercial use.

The amount of the silicone rubber can be controlled by adjusting the relative amount of silicon polymer and vinyl monomer used in the preparation of the modified epoxy resin, but is easier to adjust by varying the amount of the additional epoxy resin. For this reason, it is also preferable to use the additional epoxy resin as the additional component.

A curing agent is also used in the present invention. Typical curing agents include novolac-type phenolic resins prepared by the reaction between phenolics, such as phenol or an alkyl phenol, and an aldehyde or paraformaldehyde. Other modified novolac-type phenolic resins, aralkyl phenolic resins, amine type curing agent and acid anhydrides can also be used generally. These compounds can be used alone or in combination.

The amount of curing agent is from about 0.1 to about 10 times the stoichiometric amount of the epoxy groups of the epoxy resin(s) compared to the functional groups of the curing agent, preferably from about 0.8 to about 1.2 times.

An inorganic filler is further used in the present invention. Illustrative fillers are powders, such as crystallized silica, fused silica, alumina, talc, calcium silicate, calcium carbonate, mica, clay and titanium dioxide. Glass fibers or carbon fibers can also be used. These fillers can be used individually or in combination. From the standpoints of rate of thermal expansion and rate of conduction of heat, it is preferred to use silica powder.

The amount of the filler in the composition is from about 200 to about 800 parts to 100 parts of the epoxy resin by weight. Below about 200 parts by weight, the rate of thermal expansion is too large to obtain a good resistance to thermal shock. Above about 800 parts by weight, the flowability of the resin decreases and results in a low processability for commercial purpose.

It is also possible to add other components to the present semiconductor sealing resin composition. For example, curing promoters, such as imidazoles, tertiary amines, phenolics, organic metal compounds and organic phosphines; mold release agents, for example fatty amides, fatty acid salts and waxes; fire retardant additives, such as bromo-containing compounds, antimony and phosphorus; colored fillers, such as carbon black, and silane coupling agents, can be added to the composition in conventional amounts.

The present composition can be readily prepared as a molding composition by premixing the components in a mixer, thereafter kneading at a temperature of between about 70 and 130° C., for about 0.5 to 90 minutes by a hot roll or a fusing mixer such as a kneader.

The semiconducter sealing resin composition prepared by the present invention has the properties of low modulus of elasticity, a low rate of thermal expansion and good resistance to heat shock. Therefore, a high degree of reliability can be achieved when the present composition is used for the sealing of highly-integrated semiconductors or small and thin semiconductors, such as a flat package.

As a further advantage, the present composition also does not leave significant deposits on the mold which makes it suitable for long-term manufacturing.

The present invention is illustrated in detail by the examples which follow. The present invention should not be construed as being limited to these examples. In the following examples, a part is a part by weight unless noted differently.

PREPARATION OF THE MODIFIED EPOXY RESIN

Example 1

A mixture of ortho-cresol novolac epoxy resin (epoxy equivalent 217) 100 parts, toluene 10 parts and methacrylic acid 1.5 parts was reacted at 120 to 125° C. for 2 hours in the presence of tertiary amine. To the resultant reaction mass were added 7.5 parts of butyl acrylate, 15 parts of methacryloxy propylsilicone oligomer (from Shinetsu Chemicals), 0.6 part of azobisisovaleronitrile and 200 parts of acetic ether, and reacted at 75° C. for 4 hours. 10 parts of vinyl-modified polysiloxane and 10 parts of hydrogen-modified polysiloxane (Shinetsu Chemicals KE-1204) were added to the mass as the silicone polymer and reacted at 75° C. for two hours while stirring vigorously. The reaction mass was desolvated at 30° C. under reduced pressure.

A modified epoxy resin (epoxy equivalent 312) in which silicone rubber having an average particle diameter of 0.1m was dispersed, was thus obtained.

Example 2

A mixture of ortho-cresol novolac epoxy resin (epoxy equivalent 217) 100 parts, toluene 10 parts and methacrylic acid 1 part was reacted at 120to 125° C. for 2 hours in the presence of tertiary amine. To the resultant reaction mass were added 5 parts of butyl acrylate, 10 parts of methacryloxy propylsilicone oligomer (from Shinetsu Chemicals), 0.4 part of azobisisovaleronitrile and 100 parts of acetic ether, and reacted at 75° C. for 4 hours. 10 parts of vinyl-modified polysiloxane and 10 parts of hydrogen-modified polysiloxane (Shinetsu Chemicals KE-1204) were added to the mass as the silicone polymer and reacted at 75° C. for two hours while stirring vigorously. The reaction mass was desolvated at 130° C. under reduced pressure.

A modified epoxy resin (epoxy equivalent 295) in which silicone rubber having an average particle diameter of 0.35μ was dispersed, was thus obtained.

Example 3

A mixture of ortho-cresol novolac epoxy resin (epoxy equivalent 217) 100 parts, toluene 10 parts and methacrylic acid 0.5 part was reacted at 120 to 125° C. for 2 hours in the presence of tertiary amine. To the resultant reaction mass were added 2.5 parts of butylacrylate, 5 part of methacryloxy propyl silicone oligomer (from Shinetsu Chemicals), 0.2 part of azobisisovaleronitrile and 70 parts of acetic ether, and reacted at 75° C. for 4 hours. 10 parts of vinyl-modified polysiloxane and 10 parts of hydrogen-modified polysiloxane (Shinetsu Chemicals KE-1204) were added to the mass as the silicone polymer and reacted at 75° C. for two hours while stirring vigorously. The reaction mass was desolvated at 130° C. under reduced pressure. A modified epoxy resin (epoxy equivalent 278) in which silicone rubber average particle diameter of 1.0μ was dispersed, was obtained.

Example 4

The process of Example 2, was repeated except that 100 parts of phenol novolac epoxy resin (epoxy equivalent 200) was used instead of ortho-cresol novolac epoxy resin. The modified epoxy resin (epoxy equivalent 272), in which silicone rubber having an average particle diameter of 0.35μ was dispersed, was thus obtained.

Example 5

The process of Example 2 was repeated except that 5 parts of 2-ethylhexyl acrlyrate was used instead of using 5 parts of butyl acrylate. A modified epoxy resin (epoxy equivalent 295), in which silicone rubber having an average particle diameter of 0.35μ was dispersed, was obtained.

Example 6

The process of Example 2 was repeated except that 10 parts of vinyl polydimethylsiloxane (Chisso Corp PS 408, having the general formula described below) was used instead of 10 parts of methacryloxy propyl silicone oligomer (from Shinetsu Chemicals).

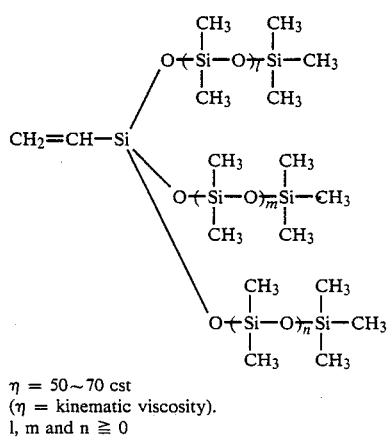

$\eta = 50\sim70$ cst
($\eta$ = kinematic viscosity).
l, m and n $\geq 0$

A modified epoxy resin (epoxy equivalent 295), in which silicone rubber having an average particle diameter of 0.7μ was dispersed, was obtained.

Example 7

The process of Example 2 was repeated except that 15 parts of vinyl-modified polysiloxane and 15 parts of hydrogen modified polysiloxane were used instead of using 10 parts of each.

A modified epoxy resin (epoxy equivalent 317), in which silicone rubber having an average particle diameter of 0.35μ was dispersed, was obtained.

Example 8

A mixture of ortho-cresol epoxy resin (epoxy equivalent 217) 100 parts, toluene 10 parts and methacrylic acid 1.5 parts was reacted at 120 to 125° C. for 2 hours in the presence of tertiary amine. To the resultant reactive mass were added 6.5 parts of butyl acrylate, 12 parts of methacryloxy propyl silicone oligomer (from Shinetsu Chemicals), 0.4 part of azobisisovaleronitrile and 100 parts of acetic ether and reacted at 75° C. for 4 hours. 70 parts of vinyl-modified polysiloxane and 70 parts of hydrogen-modified polysiloxane (Shinetsu Chemicals KE-1204) were added to the mass as the silicone polymer and reacted at 75° C. for two hours while stirring vigorously. The reaction mass was desolvated at 130° C. under reduced pressure.

A modified epoxy resin (epoxy equivalent 586), in which silicone rubber having an average particle diameter of 0.4μ was dispersed, was thus obtained.

Example 9

The process of Example 2 was repeated except that 10 parts of vinyl-modified polysiloxane and 10 parts of hydrogen-modified polysiloxane (Toray Silicone SE-1821) were used instead of Shinetsu Chemical KE-1204.

A modified epoxy resin (epoxy equivalent 295) in which silicone rubber having an average particle diameter of 0.35μ was dispersed, was obtained.

Example 10

The process of Example 2 was repeated except that as the silicone polymer, 10 parts of polymer (A) having the structure set forth below was used as the vinyl-modified polysiloxane and 8 parts of polymer (B) having structure set forth below and 2 parts of polymer (C) having structure set forth below were used as the hydrogen-modified polysiloxane.

A modified epoxy resin (epoxy equivalent 295), in which silicone rubber having an average particle diameter of 0.35μ was dispersed, was obtained.

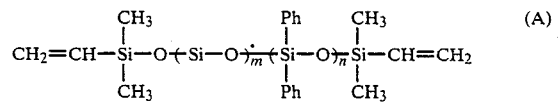

$(\frac{n}{m+n} \times 100 = 4$ to 6 and $\eta = 10,000$ cst)
(Chisso Corp. PS 765)

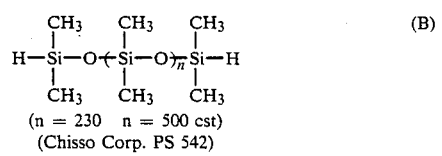

(n = 230  n = 500 cst)
(Chisso Corp. PS 542)

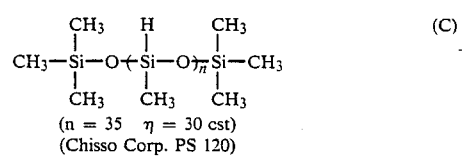

(n = 35  $\eta$ = 30 cst)
(Chisso Corp. PS 120)

EXAMPLE 11

Example 2 was repeated except that the 10 parts of the vinyl-modified polysiloxane and 10 parts of the hydrogen modified polysiloxane were substituted with 10 parts each of PS 493 and PS 129 which have the respective structural formulae.

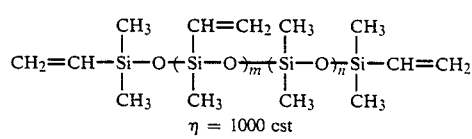

$\eta = 1000$ cst
$\frac{m}{m+n} \times 100 = 0.3\sim0.4$
(Chisso PS 493)

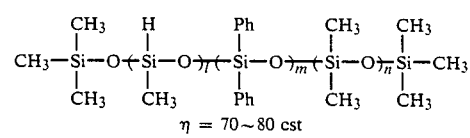

$\eta = 70\sim80$ cst $$\frac{m}{m+n} \times 100 = 15 \sim 25$$
(Chisso PS 129)

Example 12

Example 2 was repeated except that 4 parts of vinyl modified polysiloxane and 4 parts of hydrogen modified polysiloxane were used. A modified epoxy resin (epoxy equivalent 269), in which silicone rubber having an average particle diameter of $0.35\mu$ was dispersed, was obtained.

Comparative Example 1

A mixture of 100 parts ortho cresol novolac epoxy resin (epoxy equivalent 217), toluene 10 parts, methacrylic acid 0.4 parts were reacted in the presence of a tertiary amine at 120 to 125° C. for two hours. 2 parts of butyl acrylate, 4 parts of methacryroxypropylsilicone oligomer (Shinetsu Chemicals), 0.4 parts of azobisisovaleronitrile and 50 parts of acetic ether were added and reacted at 75° C. for four hours. Thereafter, 10 parts of vinyl modified polysiloxane and 10 parts of hydrogen modified polysiloxane (Shinetsu Chemicals KE 1204) were added as the addition reactive silicone polymer and reacted while stirring mildly. The reaction mass was desolvated at 130° C. under reduced pressure and thus a modified epoxy resin (epoxy equivalent 273) was obtained in which silicone rubber which has $1.3\mu$ average particle diameter were dispersed.

Comparative Example 2

A mixture of ortho-cresol novolac epoxy resin (epoxy equivalent 217) 100 parts, toluene 100 parts, silane coupling agent ($\alpha$-glycidoxy propyl trimethoxysilane from Toray Silicone) 16 parts was warmed at 75° C. and 20 parts of addition reactive silicone polymer (Shinetsu Chemicals KE-1204) was added and reacted at 75° C. for 2 hours while stirring vigorously. The reaction mass was desolvated at 130° C. under reduced pressure.

A modified epoxy resin, in which silicone rubber having a particle diameter of 1 to $5\mu$ was dispersed, was obtained.

Comparative Example 3

100 parts of ortho-cresol novolac epoxy resin (epoxy equivalent 217), 100 parts of toluene, 16 parts of epoxy-modified silicone oil (Toray Silicone) and 20 parts of dimethylpolysiloxane rubber (Toray Silicone) were mixed at 30° C. for 4 hours.

After desolvation under reduced pressure, a modified epoxy resin, in which silicone rubber having a particle diameter of 5 to $20\mu$ and irregular shape was dispersed, was obtained.

Preparation and Testing of Sealing Corporations

Sealing compositions containing the modified epoxy resins of the Examples and Comparative Examples described above were prepared by mixing the components shown in Table 1 by a mixer, then subjecting the mixture to melt mixing for 2 to 3 minutes by hot roll at 90° C. The mixture was thereafter cooled, and ground to obtain the sealing composition.

Test pieces (i.e., 16 pin DIP's equipped with $4 \times 8$ mm chips) were prepared using the sealing compositions by transfer molding (at 175° C., 70kg/cm$^2$, 3 minutes). These test pieces were subjected to post-cure treatment at 175° C. for 4 hours after molding before testing. The result of various tests are shown in Table 2.

TABLE 1

| | EXAMPLE | | | | | | | | | | | | | | | COMPARATIVE EXAMPLE | | | |
|---|---|---|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 1 | 2 | 3 | 4 |
| Epoxy resin (d) (pbw) | 52.6 | 56.0 | 56.2 | 53.8 | 56.0 | 56.0 | 32.7 | | 35.9 | 21.1 | | 56.0 | 56.0 | 56.0 | | 56.6 | 74.6 | 56.0 | 56.0 |
| Preparation No. | 1 | 2 | 3 | 4 | 5 | 6 | 2 | 7 | 8 | 8 | 8 | 9 | 10 | 11 | 12 | Comp. 1 | | Comp. 2 | Comp. 3 |
| Modified epoxy resin (a) Amount (pbw) | 46.8 | 44.0 | 41.7 | 44.0 | 44.0 | 44.0 | 68.0 | 105 | 74.3 | 92.2 | 111.9 | 44 | 44 | 44 | 100 | 41.1 | | 44 | 44.0 |
| Novolac phenolic (OH equivalent 106)(pbw) | 41.6 | 41.0 | 43.1 | 43.2 | 41.0 | 41.0 | 40.3 | 35.3 | 30.8 | 27.0 | 21.6 | 41.0 | 41.0 | 41.0 | 41.0 | 43.3 | 46.4 | 41.0 | |
| Fused silica (c) treated by coupling agent (pbw) | 400 | 400 | 400 | 400 | 400 | 400 | 400 | 400 | 400 | 400 | 400 | 400 | 400 | 400 | 400 | 400 | 400 | 400 | 400 |
| Triphenyl phosphine (pbw) | 0.85 | 0.85 | 0.85 | 0.85 | 0.85 | 0.85 | 0.85 | 0.85 | 0.85 | 0.85 | 0.85 | 0.85 | 0.85 | 0.85 | 0.85 | 0.85 | 0.85 | 0.85 | 0.85 |
| Carnuba wax (pbw) | 2.5 | 2.5 | 2.5 | 2.5 | 2.5 | 2.5 | 2.5 | 2.5 | 2.5 | 2.5 | 2.5 | 2.5 | 2.5 | 2.5 | 2.5 | 2.5 | 2.5 | 2.5 | 2.5 |
| Carbon black (pbw) | 2.0 | 2.0 | 2.0 | 2.0 | 2.0 | 2.0 | 2.0 | 2.0 | 2.0 | 2.0 | 2.0 | 2.0 | 2.0 | 2.0 | 2.0 | 2.0 | 2.0 | 2.0 | 2.0 |
| Rubber content in the epoxy resin ((a) + (d)) wt % | 6.5 | 6.5 | 6.5 | 6.5 | 6.5 | 6.5 | 10.0 | 22.0 | 40 | 50 | 53.8 | 6.5 | 6.5 | 6.5 | 6.5 | 6.5 | | | |
| Average particle diameter (μm) | 0.1 | 0.35 | 1.0 | 0.35 | 0.35 | 0.7 | 0.35 | 0.35 | 0.4 | 0.4 | 0.4 | 0.35 | 0.35 | 0.4 | 0.35 | 1.3 | | 1~5 | 5~20 | pbw = parts by weight

TABLE 2

| | Property Tests | | | | Heat-shock Mold** | |
|---|---|---|---|---|---|---|
| | Flexural Strength (kg/mm$^2$A) | Flexural Modulus (kg/mm$^2$) | Linear Expansion Coefficient × $10^{-5}$/°C. | Glass transition Temperature | Test* | Deposit |
| Example | | | | | | |
| 1 | 11.2 | 1280 | 1.9 | 160 | 0/10 | no |
| 2 | 11.0 | 1300 | 1.9 | 160 | 0/10 | no |
| 3 | 11.0 | 1320 | 1.9 | 160 | 1/10 | no |
| 4 | 10.8 | 1290 | 1.9 | 160 | 0/10 | no |
| 5 | 11.1 | 1280 | 1.9 | 160 | 0/10 | no |
| 6 | 10.5 | 1310 | 1.9 | 160 | 1/10 | no |
| 7 | 10.7 | 1230 | 1.9 | 160 | 0/10 | no |
| 8 | 10.3 | 1100 | 1.9 | 160 | 0/10 | no |
| 9 | 9.0 | 920 | 1.9 | 160 | 0/10 | no |
| 10 | 8.0 | 800 | 1.9 | 160 | 1/10 | no |
| 11 | 7.5 | 750 | 1.9 | 160 | 2/10 | no |
| 12 | 11.0 | 1280 | 1.9 | 160 | 0/10 | no |
| 13 | 10.8 | 1300 | 1.9 | 160 | 0/10 | no |
| 14 | 11.1 | 1300 | 1.9 | 160 | 0/10 | no |
| 15 | 11.1 | 1290 | 1.9 | 160 | 0/10 | no |
| Comparative Example | | | | | | |
| 1 | 10.8 | 1330 | 1.9 | 160 | 5/10 | no |
| 2 | 12.5 | 1650 | 2.1 | 160 | 10/10 | no |
| 3 | 10.5 | 1350 | 1.9 | 158 | 10/10 | no |
| 4 | 11.0 | 1320 | 1.9 | 157 | 10/10 | yes |

*The number of cracking after 30 cycles of placing the piece in 280° C., 2 minutes and −196° C., 2 minutes.
**Surface of the mold was checked by eye after molding 20 times by the same mold.

What is claimed is:

1. A semiconductor sealing resin composition which comprises;
    (a) a modified epoxy resin which is a graft copolymer of a epoxy resin and a vinyl polymer, said modified epoxy resin having dispersed therein a silicone rubber with an average particle diameter less than 1.0μ;
    (b) a curing agent; and
    (c) an inorganic filler.

2. The composition of claim 1 wherein the composition further comprises a non-modified epoxy resin.

3. The composition of claim 1 wherein the epoxy resin in (a) is a phenol novolac epoxy resin or a novolac epoxy resin.

4. The composition of claim 1 wherein the graft copolymer in (a) is prepared by polymerizing a vinyl monomer in the presence of the epoxy resin.

5. The composition of claim 4 wherein the amount of the vinyl monomer is from about 1 to about 50 parts to 100 parts of the epoxy resin by weight.

6. The composition of claim 4 wherein the epoxy resin contains a polymerizable double bond or a graft polymerizable bond prior to reaction with the vinyl monomer.

7. The composition of claim 1 wherein the silicone rubber is prepared by addition reaction of a silation reaction between a vinyl-modified silicone polymer which has at least one vinyl group within the molecule and a hydrogen-modified silicone polymer which has at least two active hydrogens within the molecule.

8. The composition of claim 7 wherein the ratio by weight of the vinyl-modified silicone polymer to the hydrogen-modified silicone polymer is from about 0.1:10 to 10:0.1.

9. The composition of claim 1 wherein the particle diameter of the silicone polymer is less than 0.5μ.

10. The composition of claim 1 wherein the particle diameter of the silicone polymer is more than 0.01μ.

11. The composition of claim 1 wherein the amount of the silicone rubber is 5 to 50% by weight of the total amount of epoxy resin in the composition.

12. The composition of claim 1 wherein the amount of the silicone rubber is 10 to 20% by weight of the total amount of the epoxy resin in the composition.

13. The composition of claim 1 wherein the curing agent is a novolac phenolic resin.

14. The composition of claim 1 wherein the inorganic filler is crystalline silica or fused silica.

15. The composition of claim 1 wherein the amount of curing agent is about 0.1 to 10 the stoichiometric amount of the epoxy groups.

16. The composition of claim 1 wherein the amount of the inorganic filler is about 200 to 800 parts by weight to 100 parts by weight of the modified epoxy resin.

* * * * *